(12) United States Patent
Jiang et al.

(10) Patent No.: US 11,283,040 B2
(45) Date of Patent: Mar. 22, 2022

(54) LIGHT-EMITTING DEVICE AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Pei Jiang, Shenzhen (CN); Chiayu Lee, Shenzhen (CN); Chunche Hsu, Shenzhen (CN); Shujhih Chen, Shenzhen (CN); Bo He, Shenzhen (CN); Yongwei Wu, Shenzhen (CN); Yongming Yin, Shenzhen (CN); Miao Duan, Shenzhen (CN)

(*) Notice: Subject to any disclaimer, the term of this patent is extended or adjusted under 35 U.S.C. 154(b) by 155 days.

(21) Appl. No.: 16/627,347

(22) PCT Filed: Dec. 20, 2019

(86) PCT No.: PCT/CN2019/126877
§ 371 (c)(1),
(2) Date: Dec. 30, 2019

(87) PCT Pub. No.: WO2021/114366
PCT Pub. Date: Jun. 17, 2021

(65) Prior Publication Data
US 2021/0328169 A1    Oct. 21, 2021

(30) Foreign Application Priority Data
Dec. 10, 2019 (CN) .......................... 201911257223.5

(51) Int. Cl.
*H01L 51/50* (2006.01)
*H01L 51/56* (2006.01)

(52) U.S. Cl.
CPC ...... *H01L 51/5056* (2013.01); *H01L 51/5072* (2013.01); *H01L 51/5092* (2013.01); *H01L 51/5096* (2013.01); *H01L 51/56* (2013.01)

(58) Field of Classification Search
CPC ............. H01L 51/5056; H01L 51/5096; H01L 51/5072; H01L 51/5092
See application file for complete search history.

(56) References Cited

U.S. PATENT DOCUMENTS

2017/0222162 A1   8/2017   Lee et al.
2018/0033976 A1   2/2018   Guo

FOREIGN PATENT DOCUMENTS

| CN | 104681731 A | 6/2015 |
| CN | 108091768 A | 5/2018 |
| CN | 110311060 A | 10/2019 |

*Primary Examiner* — Anthony Ho

(57) ABSTRACT

A light-emitting device and a manufacturing method thereof are provided. The light-emitting device includes an anode, a luminous layer, and a cathode, which are disposed in a stacked manner, and a material of the luminous layer includes a perovskite material. A first transport layer is further provided between the luminous layer and the anode, and the first transport layer is configured to transport holes. Alternatively, a second transport layer is further provided between the cathode and the luminous layer, and the second transport layer is configured to transport electrons.

9 Claims, 5 Drawing Sheets

LIGHT-EMITTING DEVICE AND MANUFACTURING METHOD THEREOF

FIELD OF INVENTION

The present application relates to the field of display technologies, and in particular, to a light-emitting device and a manufacturing method thereof.

BACKGROUND OF INVENTION

Present light-emitting devices, since most organic luminescent materials exhibit unipolar transmission, they have different transport properties for different carriers, resulting in an imbalance in the injection and transmission rates of electrons and holes. Therefore, the luminous efficiency of the light-emitting device is greatly reduced.

SUMMARY OF INVENTION

Technical Problem

The technical problem mainly solved by the present application is that since most organic luminescent materials exhibit unipolar transport and have different transport properties for different carriers, resulting in an imbalance in the injection and transmission rates of electrons and holes, the luminous efficiency of the light-emitting device is greatly reduced.

Technical Solutions

In a first aspect, the present application provides a light-emitting device, including: an anode, a luminous layer, and a cathode disposed in a stack, wherein material of the luminous layer includes a perovskite material;

wherein a first transport layer is further provided between the luminous layer and the anode, and the first transport layer is configured to transport holes;

alternatively, a second transport layer is further provided between the cathode and the luminous layer, and the second transport layer is configured to transport electrons.

In the light-emitting device provided in the present application, the first transport layer includes one or more of a hole injection layer, a hole transport layer, and an electron blocking layer.

In the light-emitting device provided in the present application, the second transport layer includes one or more of an electron injection layer, an electron transport layer, and a hole blocking layer.

In the light-emitting device provided in the present application, the cathode includes a metal compound layer and a metal layer;

the metal compound layer is disposed on the luminous layer, and the metal layer is disposed on the metal compound layer;

alternatively, the metal compound layer is disposed on the second transport layer, and the metal layer is disposed on the metal compound layer.

In the light-emitting device provided in the present application, a thickness of the metal compound layer ranges from 0.5 nm to 1.5 nm, and a thickness of the metal layer ranges from 90 nm to 110 nm.

In the light-emitting device provided in the present application, a thickness of the luminous layer is greater than 120 nm.

In a second aspect, the present application provides a method for manufacturing a light-emitting device, including:

providing an anode;

forming a first transport layer on the anode, wherein the first transport layer is configured to transport holes;

forming a luminous layer on the first transport layer, wherein material of the luminous layer includes a perovskite material; and forming a cathode on the luminous layer.

In the manufacturing method provided in the present application, forming a luminous layer on the first transport layer includes:

coating a luminescent material solution on a surface of the first transport layer; and evaporating the luminescent material solution to obtain a luminous layer.

In the manufacturing method provided in the present application, after coating a luminescent material solution on a surface of the first transport layer, before evaporating the luminescent material solution to obtain a luminous layer, the manufacturing method includes:

detecting whether a concentration of the luminescent material solution is greater than a preset concentration or not;

if the concentration of the luminescent material solution is greater than the preset concentration, reducing an evaporation rate of evaporating the luminescent material solution according to the concentration of the luminescent material solution; and wherein the step of evaporating the luminescent material solution to obtain a luminous layer includes: evaporating the luminescent material solution according to the evaporation rate to obtain the luminous layer.

In a third aspect, the present application provides a method for manufacturing a light-emitting device, including:

providing an anode;

forming a luminous layer on the anode, wherein material of the luminous layer includes a perovskite material;

forming a second transport layer on the luminous layer, wherein the second transport layer is configured to transport electrons; and forming a cathode on the second transport layer.

Beneficial Effect

The beneficial effect of the present application is that a first transport layer is further provided between the luminous layer and the anode, and the first transport layer is configured to transport holes; alternatively, a second transport layer is further provided between the cathode and the perovskite luminous layer, and the second transport layer is configured to transport electrons. The light-emitting device and the manufacturing method thereof provided by the present application can improve the luminous efficiency of the light-emitting devices.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
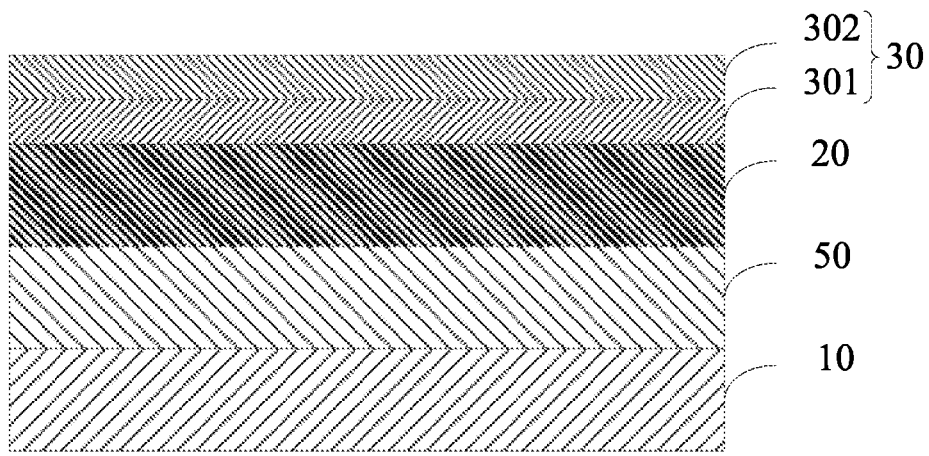
FIG. 1 is a schematic structural diagram of a first embodiment of a light-emitting device provided by the present application.

The embodiments of the present application are described in detail below, and examples of the embodiments are shown in the drawings, wherein same or similar reference numerals indicate same or similar elements or elements having same or similar functions throughout. The embodiments described below with reference to the drawings are exemplary and are only configured to explain the present application, and should not be construed as limiting the present application.

Figure 2:
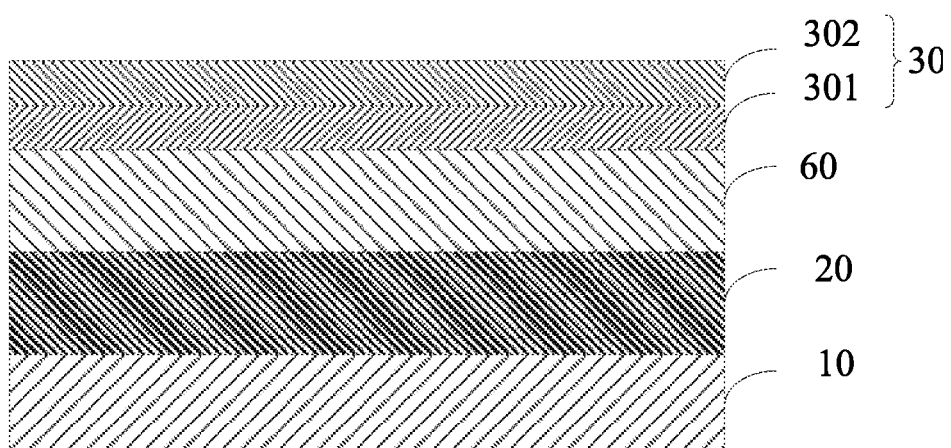
FIG. 2 is a schematic structural diagram of a second embodiment of the light-emitting device provided by the present application.

Please refer to FIG. 1 and FIG. 2, where FIG. 1 is a schematic structural diagram of a first embodiment of a light-emitting device provided in the present application, and FIG. 2 is a schematic structural diagram of a second embodiment of the light-emitting device provided in the present application. The present application provides a light-emitting device 1, including an anode 10, a luminous layer 20, and a cathode 30, which are disposed in a stack, and material of the luminous layer 20 includes a perovskite material.

In some embodiments, referring to FIG. 1, a first transport layer 50 is further provided between the luminous layer 20 and the anode 10, and the first transport layer 50 is configured to transport holes. Here, it should be noted that the perovskite material used in the present application can be an ABX3 type perovskite material, where A can be an organic cation, such as methylamine (MA+), formamidine (FA+), or cesium (Cs+), B can be lead (Pb2+) or tin (Sn2+), and X can be a halogen anion, such as chlorine (Cl−), bromine (Br−), or iodine (I−). Compared with ordinary organic luminescent materials, perovskite materials have excellent photoelectric performance. It can efficiently complete multiple processes such as excitation, transport, and separation of carrier as well. More importantly, perovskite materials have excellent bipolar carrier transport properties and can efficiently transport electrons and holes. In the present embodiment, since the first transport layer 50 is configured to transport holes, the luminous layer 20 is configured to transport electrons and holes. A transport length of the luminous layer 20 to transport electrons and holes is greater than 1 micron, and the luminous layer 20 can also realize light emission.

In some embodiments, the first transport layer 50 can include one or more of a hole injection layer, a hole transport layer, and an electron blocking layer. The first transport layer 50 is specifically set according to actual conditions, and details are not described herein again.

In some embodiments, a thickness of the luminous layer 20 is greater than 120 nanometers.

Compared with conventional light-emitting devices, the luminous layer 20 of the light-emitting device 1 provided by the present application uses a perovskite material, which reduces interface transmission, thereby improving the luminous efficiency of the light-emitting device 1 and greatly reducing the complexity of the manufacturing process. Moreover, the range of hole transport materials to choose from is also wider.

In some embodiments, please refer to FIG. 2, where the present application further provides a light-emitting device 1. The difference between the light-emitting device 1 shown in FIG. 2 and the light-emitting device 1 shown in FIG. 1 is that: a second transport layer 60 is further provided between the cathode 30 and the luminous layer 20, and the second transport layer 60 is configured to transport electrons.

In some embodiments, the second transport layer 60 includes one or more of an electron injection layer, an electron transport layer, and a hole blocking layer. The second transport layer 60 is specifically set according to the actual situation, and details are not described herein again.

In the present embodiment, since the second transport layer 60 is configured to transport electrons, the luminous layer 20 is configured to transport electrons and holes. The transport length of the luminous layer 20 to transport electrons and holes is greater than 1 micron, and the luminous layer 20 can also realize light emission. Compared with conventional light-emitting devices, the luminous layer 20 of the light-emitting device 1 provided by the present application uses a perovskite material, which reduces interface transmission, thereby improving the luminous efficiency of the light-emitting device 1 and greatly reducing the complexity of the manufacturing process. Moreover, the range of hole transport materials to choose from is also wider.

Furthermore, the cathode includes a metal compound layer 301 and a metal layer 302. In some embodiments, the metal compound layer 301 is disposed on the luminous layer 20, and the metal layer 302 is disposed on the metal compound layer 301, as shown in FIG. 1. In some embodiments, the metal compound layer 301 is disposed on the second transport layer 60, and the metal layer 302 is disposed on the metal compound layer 301, as shown in FIG. 2.

In some embodiments, a thickness of the metal compound layer 301 ranges from 0.5 nm to 1.5 nm, and a thickness of the metal layer 302 ranges from 90 nm to 110 nm.

For example, the material of the metal compound layer 301 can be lithium fluoride, the material of the metal layer 302 can be aluminum, the thickness of the metal compound layer 301 can be 1 nanometer, and the thickness of the metal layer 302 can be 100 nanometers.

By setting the cathode 30 in a two-layer structure and setting a layer close to the luminous layer 20 as the metal oxide layer 301, an electron transmission rate can be increased, and the luminous efficiency of the light-emitting device 1 can be further improved.

Of course, the cathode 30 can also be a single-layer structure, for example, silver can be used as the material of the cathode 30 as long as its low work function meets the requirements of the cathode 30, and details are not described herein.

Figure 3:
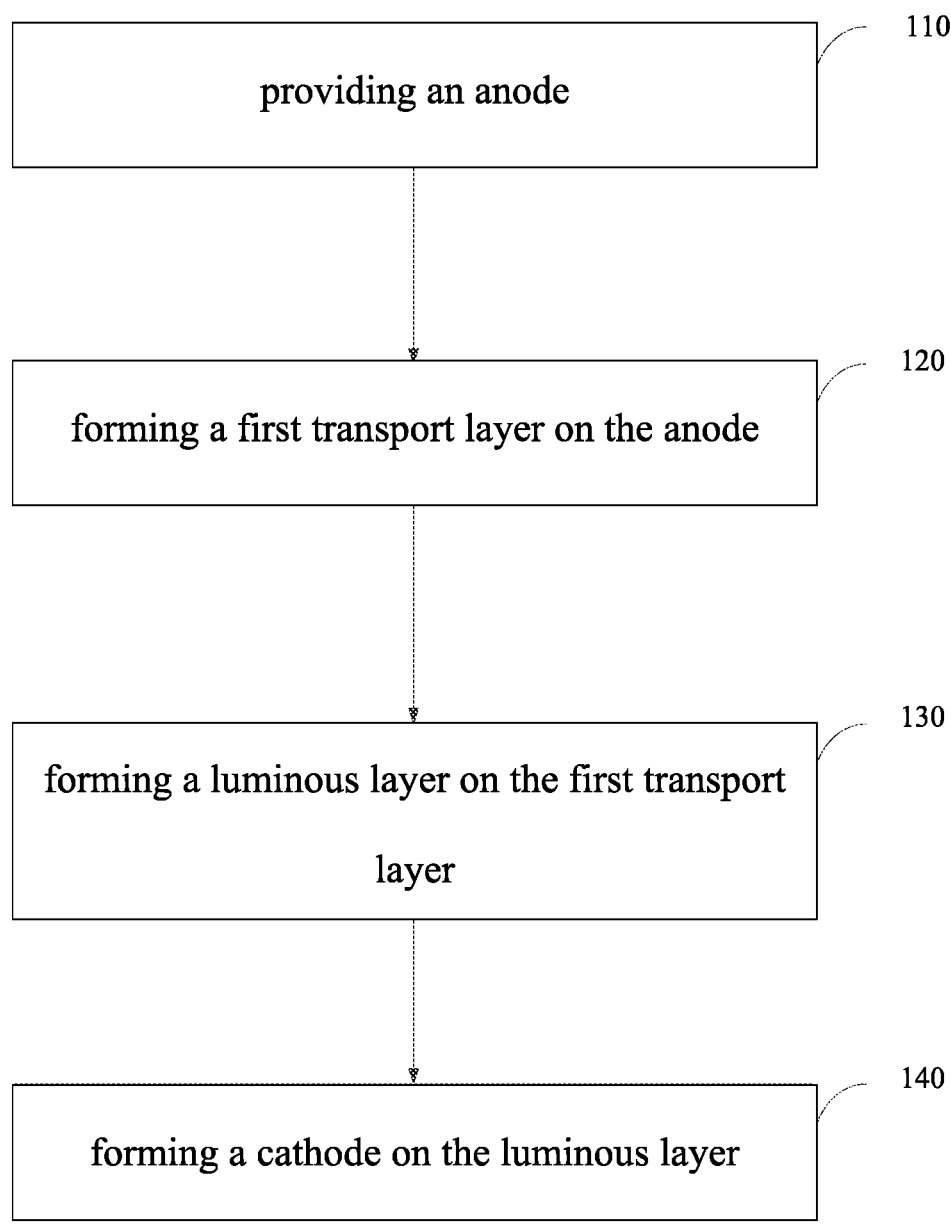
FIG. 3 is a schematic structural diagram of a first embodiment of a method for manufacturing the light-emitting device provided by the present application.

Accordingly, the present application also provides a method for manufacturing a light-emitting device. In some embodiments, please refer to FIG. 3, the method for manufacturing the light-emitting device includes:

110, providing an anode;

120, forming a first transport layer on the anode;

130, forming a luminous layer on the first transport layer; and 140, forming a cathode on the luminous layer.

Meanwhile, the first transport layer is configured to transport holes, and the material of the luminous layer includes a perovskite material. For example, referring to FIG. 4, firstly coating a luminescent material solution on a surface of the first transport layer 50. The luminescent material solution can be a perovskite solution, which can be applied to the surface of the first transport layer 50 by spin-coating. Next, the luminescent material solution was evaporated to obtain a luminous layer 20. Finally, a cathode material can be deposited on a surface of the luminous layer 20, or an evaporation method can be adopted to form the cathode 30 on the surface of the luminous layer 20.

It should be noted that, in order to make the thickness of the luminous layer 20 consistent with a preset thickness, an evaporation rate of the evaporated luminous layer 20 can be adjusted, that is, in some embodiments, after coating the luminescent material solution on the surface of the first transport layer, before evaporating the luminescent material solution to obtain the luminous layer, the manufacturing method can further specifically include:

(11) detecting whether a concentration of the luminescent material solution is greater than a preset concentration or not;

(12) if the concentration of the luminescent material solution is greater than the preset concentration, reducing an evaporation rate of evaporating the luminescent material solution according to the concentration of the luminescent material solution.

For example, when the concentration of the luminescent material solution is 10 moles and the preset concentration is 5 moles, the current evaporation rate is 5 microns per minute, and the current evaporation rate can be reduced to 2.5 microns per minute.

In addition, in some embodiments, when the concentration of the luminescent material solution is less than the preset concentration, the evaporation rate of the evaporated luminescent material solution can be increased, that is, after coating the luminescent material solution on the surface of the first transport layer, before evaporating the luminescent material solution to obtain the luminous layer, the manufacturing method can further specifically include:

(21) detecting whether a concentration of the luminescent material solution is less than a preset concentration or not;

(22) If the concentration of the luminescent material solution is greater than the preset concentration, increasing an evaporation rate of evaporating the luminescent material solution according to the concentration of the luminescent material solution.

In addition, in some embodiments, before providing an anode, the manufacturing method can further specifically include:

(31) providing a substrate;

(32) processing an ultraviolet ozone treatment on a surface of the substrate to obtain the anode.

The present application provides a method for manufacturing a light-emitting device, including: providing an anode, forming a first transport layer on the anode, forming a luminous layer on the first transport layer, and forming a cathode on the luminous layer, by manufacturing a perovskite luminous layer on the first transport layer to reduce an interface transmission, so the luminous efficiency of the light-emitting device 1 can be improved, and the complexity of the manufacturing process is greatly reduced, thereby reducing the process cost.

Figure 4:
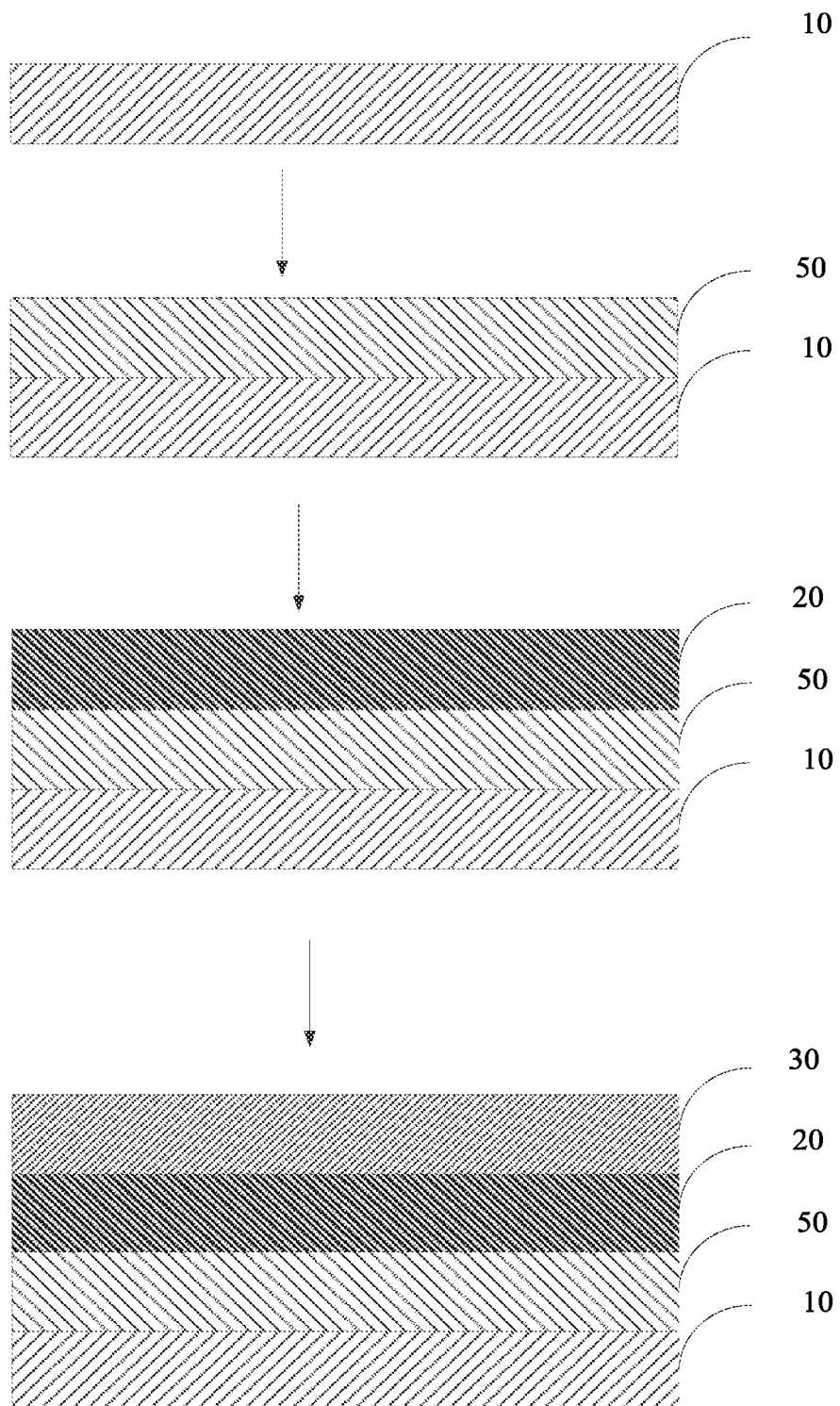
FIG. 4 is a schematic view showing steps of the first embodiment of the method for manufacturing the light-emitting device provided by the present application.

In some embodiments, please refer to FIG. 4, where the method for manufacturing the light-emitting device includes:

210, providing an anode;

220, forming a luminous layer on the anode;

230, forming a second transport layer on the luminous layer; and 240, forming a cathode on the second transport layer.

Figure 5:
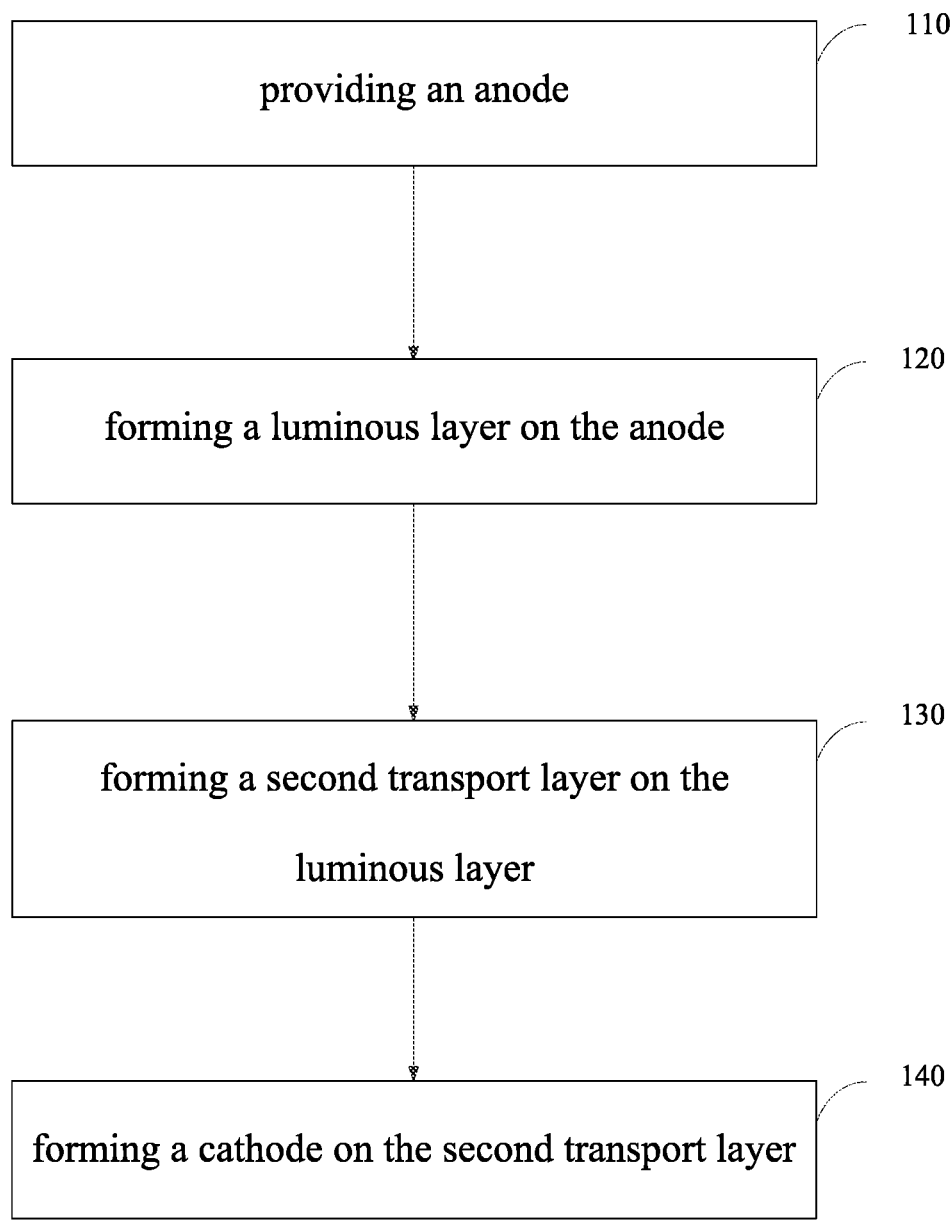
FIG. 5 is a schematic structural diagram of a second embodiment of the method for manufacturing the light-emitting device according to the present application.
Figure 6:
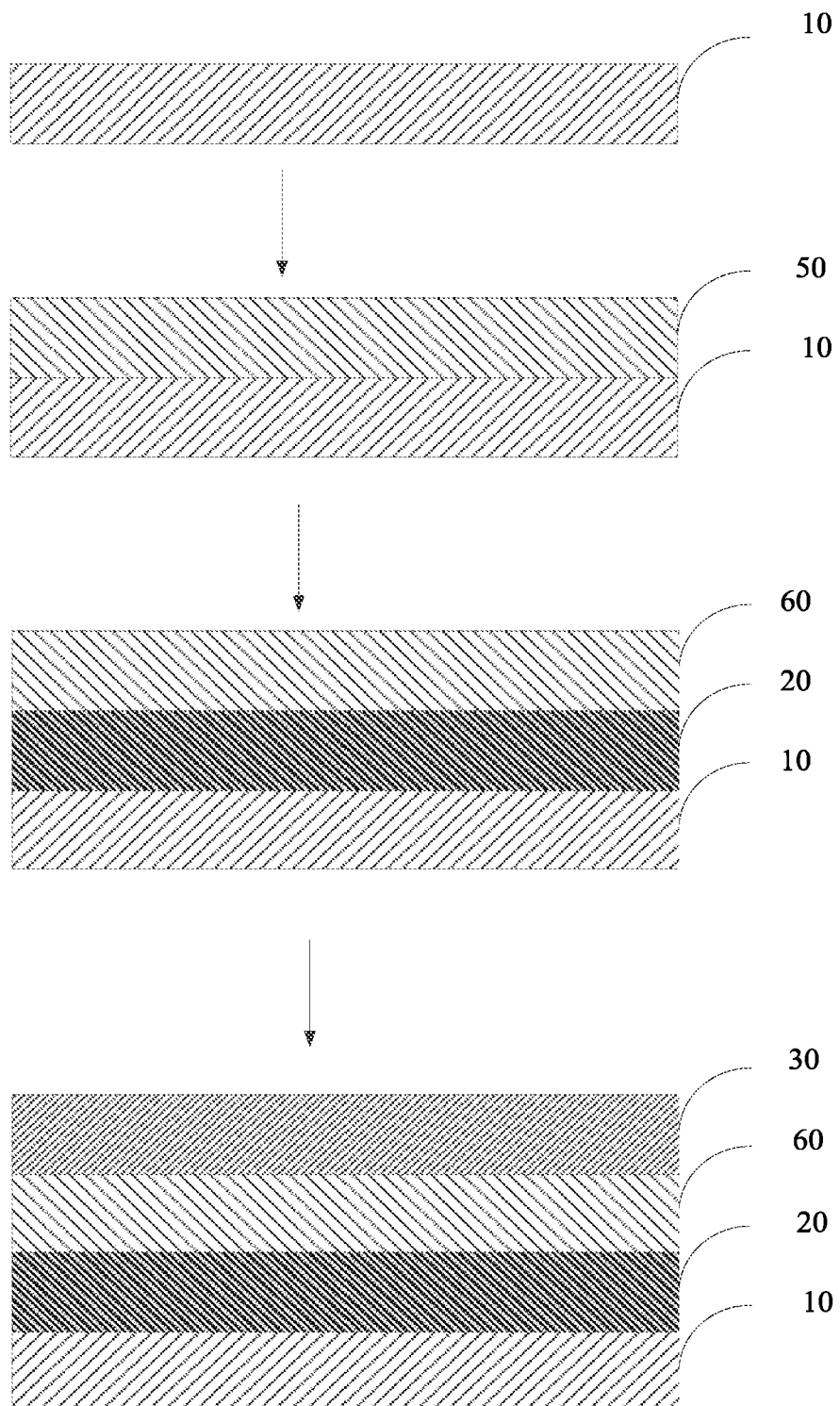
FIG. 6 is a schematic view showing steps of the second embodiment of the method for manufacturing the light-emitting device provided by the present application.

Meanwhile, the second transport layer is configured to transport electrons, and the material of the luminous layer includes a perovskite material. For example, referring to FIG. 5, firstly coating a luminescent material solution on a surface of the anode 10. The luminescent material solution can be a perovskite solution, which can be applied to the surface of the anode 10 by spin-coating. Next, the luminescent material solution was evaporated to obtain a luminous layer 20. Next, the second transport layer 60 is vapor-deposited on a surface of the luminous layer 20. Finally, a cathode material can be deposited on a surface of the second transport layer 60, or an evaporation method can be adopted to form the cathode 30 on the surface of the second transport layer 60.

The application provides a method for manufacturing a light-emitting device, including providing an anode, forming a luminous layer on the anode, and forming a second transport layer on the luminous layer, by manufacturing a perovskite luminous layer on the first transport layer to reduce an interface transmission, so the luminous efficiency of the light-emitting device 1 can be improved, and the complexity of the manufacturing process is greatly reduced, thereby reducing the process cost.

The light-emitting device and the manufacturing method thereof provided in the embodiments of the present application have been described in detail above. Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A light-emitting device, comprising: an anode, a luminous layer, and a cathode disposed in a stack, wherein material of the luminous layer comprises a perovskite material;

wherein a first transport layer is further provided between the luminous layer and the anode, and the first transport layer is configured to transport holes; and alternatively, a second transport layer is further provided between the cathode and the luminous layer, and the second transport layer is configured to transport electrons; and wherein the cathode comprises a metal compound layer and a metal layer;

the metal compound layer is disposed on the luminous layer, and the metal layer is disposed on the metal compound layer; and alternatively, the metal compound layer is disposed on the second transport layer, and the metal layer is disposed on the metal compound layer.

2. The light-emitting device according to claim 1, wherein the first transport layer comprises one or more of a hole injection layer, a hole transport layer, and an electron blocking layer.

3. The light-emitting device according to claim 1, wherein the second transport layer comprises one or more of an electron injection layer, an electron transport layer, and a hole blocking layer.

4. The light-emitting device according to claim 1, wherein a thickness of the metal compound layer ranges from 0.5 nm to 1.5 nm, and a thickness of the metal layer ranges from 90 nm to 110 nm.

5. The light-emitting device according to claim 1, wherein a thickness of the luminous layer is greater than 120 nm.

6. A method for manufacturing a light-emitting device, comprising:
   providing an anode;
   forming a first transport layer on the anode, wherein the first transport layer is configured to transport holes;
   forming a luminous layer on the first transport layer, wherein material of the luminous layer comprises a perovskite material; and
   forming a cathode on the luminous layer, wherein the cathode comprises a metal compound layer and a metal layer; the metal compound layer is disposed on the luminous layer, and the metal layer is disposed on the metal compound layer; and alternatively, the metal compound layer is disposed on the second transport layer, and the metal layer is disposed on the metal compound layer.

7. The manufacturing method according to claim 5, wherein forming a luminous layer on the first transport layer comprises:
   coating a luminescent material solution on a surface of the first transport layer; and
   evaporating the luminescent material solution to obtain a luminous layer.

8. The manufacturing method according to claim 7, wherein after coating a luminescent material solution on a surface of the first transport layer, before evaporating the luminescent material solution to obtain a luminous layer, the manufacturing method comprises:
   detecting whether a concentration of the luminescent material solution is greater than a preset concentration or not;
   if the concentration of the luminescent material solution is greater than the preset concentration, reducing an evaporation rate of evaporating the luminescent material solution according to the concentration of the luminescent material solution; and
   wherein the step of evaporating the luminescent material solution to obtain a luminous layer comprises: evaporating the luminescent material solution according to the evaporation rate to obtain the luminous layer.

9. A method for manufacturing the light-emitting device according to claim 1.

* * * * *